(12) United States Patent
Anders et al.

(10) Patent No.: US 7,196,546 B2
(45) Date of Patent: Mar. 27, 2007

(54) LOW-SWING BUS DRIVER AND RECEIVER

(75) Inventors: Mark A. Anders, Hillsboro, OR (US); Peter Caputa, Linkoping (SE); Ram Krishnamurthy, Portland, OR (US)

(73) Assignee: Intel Corporation, Santa Clara, CA (US)

( * ) Notice: Subject to any disclaimer, the term of this patent is extended or adjusted under 35 U.S.C. 154(b) by 539 days.

(21) Appl. No.: 10/748,833

(22) Filed: Dec. 30, 2003

(65) Prior Publication Data

US 2005/0148102 A1 Jul. 7, 2005

(51) Int. Cl.
*H03K 19/0175* (2006.01)

(52) U.S. Cl. .............................. 326/81; 326/68; 326/86; 327/112; 327/333; 327/390

(58) Field of Classification Search ............ 326/62–63, 326/68, 80–83, 86; 327/112, 333, 390
See application file for complete search history.

(56) References Cited

U.S. PATENT DOCUMENTS

| 5,111,080 | A | * | 5/1992 | Mizukami et al. ............. 326/30 |
| 5,469,081 | A | * | 11/1995 | Horita et al. .................. 326/81 |
| 5,541,532 | A | * | 7/1996 | McCall ......................... 326/68 |
| 6,441,653 | B1 | * | 8/2002 | Spurlin ......................... 327/108 |
| 6,972,587 | B2 | * | 12/2005 | Zimlich ......................... 326/10 |

* cited by examiner

*Primary Examiner*—Rexford Barnie
*Assistant Examiner*—Jason Crawford
(74) *Attorney, Agent, or Firm*—Buckley, Maschoff & Talwalkar LLC

(57) ABSTRACT

According to some embodiments, provided are a static low-swing driver circuit to receive a full-swing input signal, to convert the full-swing input signal to a low-swing signal, and to transmit the low-swing signal, and a dynamic receiver circuit to receive the low-swing signal and to convert the low-swing signal to a full-swing signal. Also provided may be an interconnect coupled to the driver circuit and to the receiver circuit, the interconnect not comprising a repeater and to receive the low-swing signal from the driver circuit and to transmit the low-swing signal to the receiver circuit.

12 Claims, 7 Drawing Sheets

001

LOW-SWING BUS DRIVER AND RECEIVER

BACKGROUND

The performance of conventional microprocessors may be limited by RC characteristics of on-chip interconnects. These characteristics may delay signals that are transmitted over the interconnects. For example, the effective coupling capacitance of a signal line is equal to $C_c$ multiplied by a Coupling Capacitance Multiplier (CCM). The CCM for a particular signal line is dependent upon the relative directions of signal transitions within the particular signal line and within a neighboring line. If the particular signal line carries a signal transition from a first signal level to a second signal level, CCM for the signal line is 1 if the neighboring line does not carry a signal transition, 0 if the neighboring line carries a signal transition from the first signal level to the second signal level, and 2 if the neighboring line carries a signal transition from the second signal level to the first signal level.

FIG. 1 illustrates a conventional static bus architecture for the purpose of explaining capacitive effects that result from adjacent signal transitions on neighboring signal lines. Bus 1 includes signal paths 10, 20 and 30. Signal path 10 comprises driver flip-flop 11, receiver flip-flop 12 and repeaters 13 through 16 connected serially therebetween. Repeaters 13 through 16 are intended to reduce signal delays caused by path 10 by creating a linear relationship between the length of signal path 10 and the signal delay associated therewith. Moreover, repeaters 13 through 16 are inverters that convert a received signal of a first signal level to an output signal of a second signal level. Signal paths 20 and 30 are constructed similarly to signal path 10.

FIG. 2 is a timing diagram illustrating signals on signal paths 10, 20 and 30 of bus 1. The diagram assumes that the bit values "1", "0" and "1" are to be transmitted over signal paths 10, 20 and 30, respectively. As shown, each of these values initially undergoes a transition between time $t_1$ and $t_2$ due to a respective one of repeaters 13, 23 and 33. In particular, repeater 23 converts the signal on path 20 from a low signal level to a high signal level and repeaters 13 and 33 convert the signals on paths 10 and 30 from a high signal level to a low signal level. Accordingly, CCM of signal path 20 relative to signal path 10 is 2, and relative to signal path 30 is also 2. In addition, transitions occurring between times $t_3$ and $t_4$, $t_5$ and $t_6$, and $t_7$ and $t_8$ each result in a CCM of 2 for signal path 20 relative to signal path 10, and a CCM of 2 for signal path 20 relative to signal path 30. The resulting impact on worst-case delay, energy and peak supply current often renders the architecture of bus 1 unsuitable.

The delay of a bus can be improved by avoiding the worst-case situation of a CCM that is equal to 2. One approach uses a dynamic bus, in which bus segments pre-charge during one clock phase and conditionally evaluate in the next phase. Such a dynamic bus provides a worst-case CCM of 1 because all bus segments pre-charge and evaluate in a same direction. However, dynamic buses require additional clock routing and power for pre-charging even in the absence of input switching activity. The addition of aggressively-sized repeaters within such a bus may also contribute significantly to power consumption.

DETAILED DESCRIPTION

In the following description, particular types of circuits and circuit elements are described for purposes of illustration. Other embodiments, however, may utilize other types of circuits. Further, although complementary metal-oxide semiconductor (CMOS) transistors are referred to in the illustrations that follow, it will be appreciated by those of ordinary skill in the art that some embodiments may be implemented using various other types of processing technologies.

Figure 1:
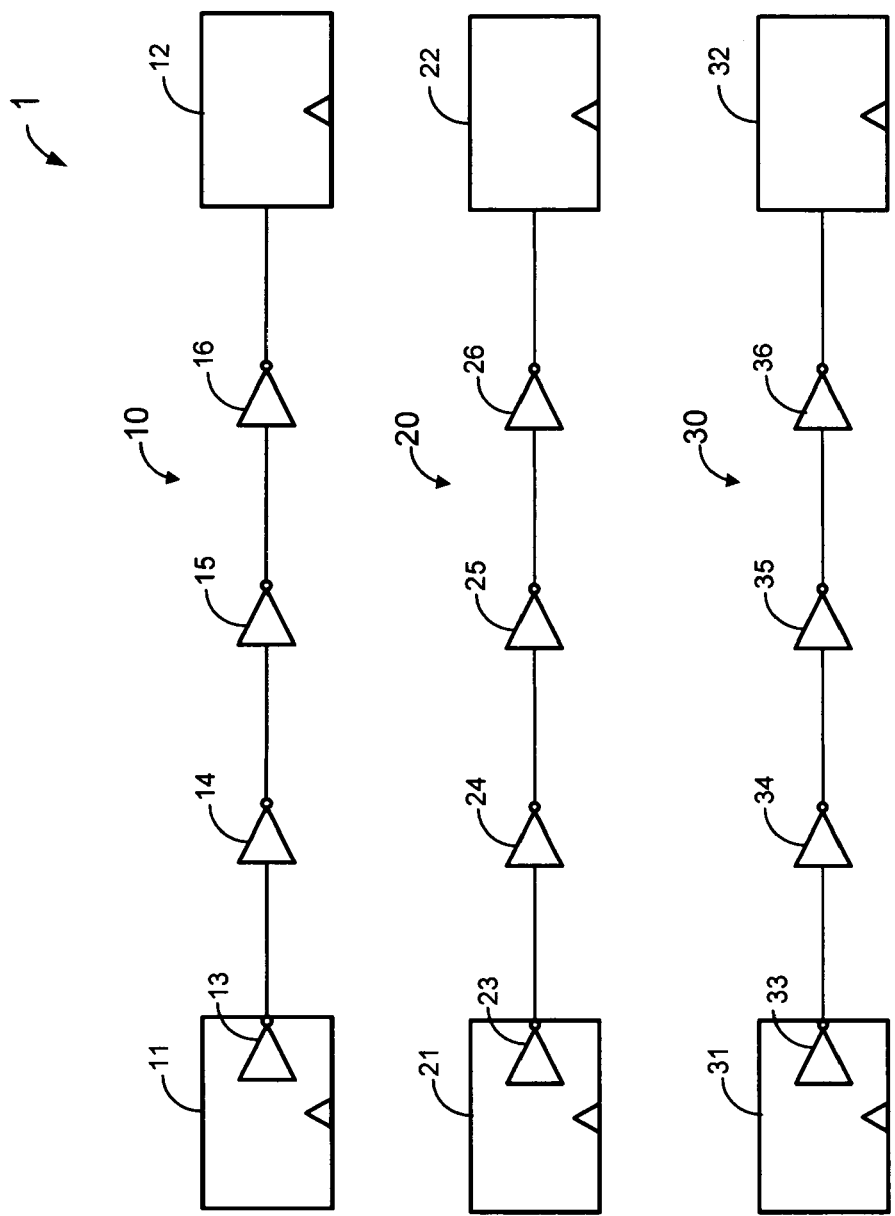
FIG. 1 is a logical diagram of a conventional bus.
Figure 2:
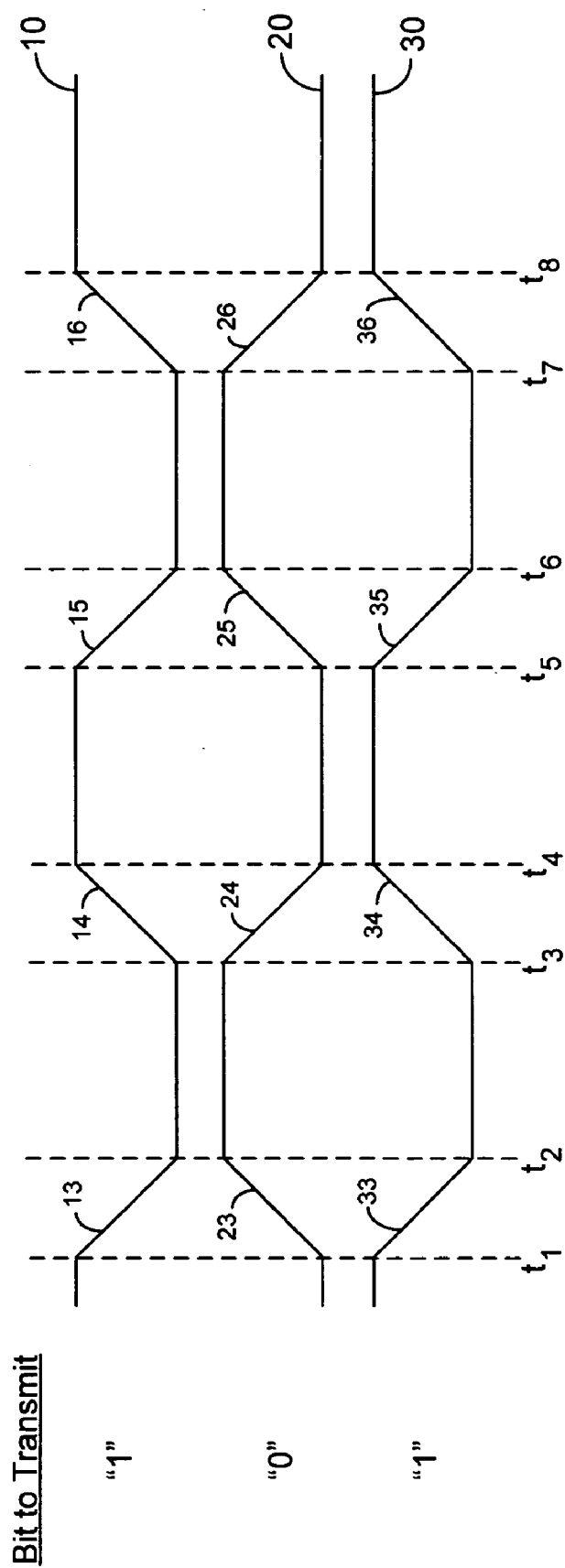
FIG. 2 is a timing diagram of signals on a conventional bus.
Figure 3:
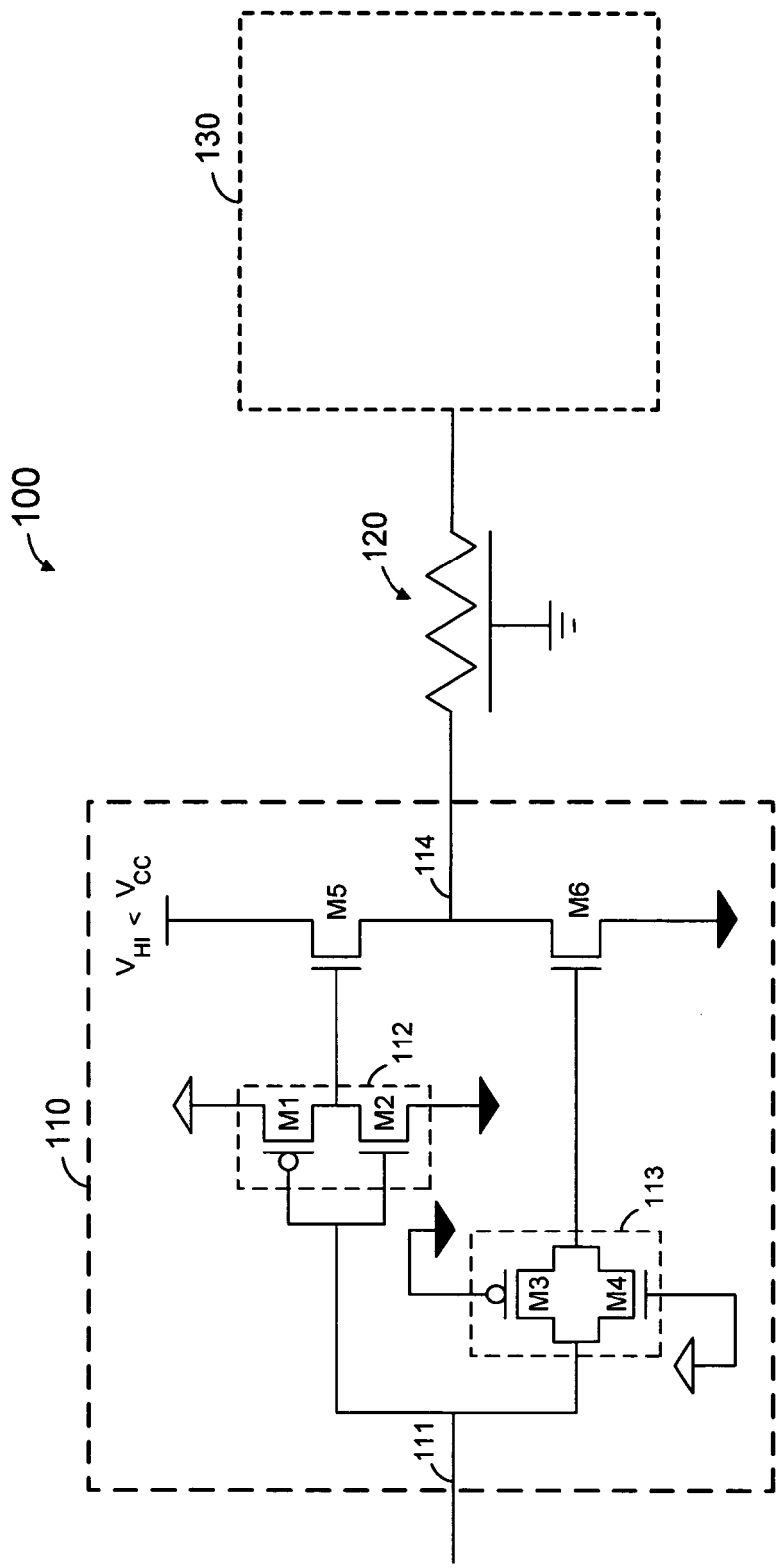
FIG. 3 is a schematic diagram of a driver according to some embodiments.

FIG. 3 is a schematic diagram of system 100 according to some embodiments. System 100 comprises static low-swing driver circuit 110, interconnect 120 and dynamic receiver circuit 130. Static low-swing driver circuit 110 may receive a full-swing input signal, convert the full-swing input signal to a low-swing signal, and transmit the low-swing signal. Additionally, dynamic receiver circuit 130 may receive the low-swing signal and convert the low-swing signal to a full-swing signal.

System 100 may be used in any suitable implementation, including but not limited to an on-chip communication bus. In this regard, system 100 may comprise one bit-line of a multi-line communication bus. According to some embodiments, a communication bus comprises 256 parallel instances of system 100.

Driver circuit 110 comprises input line 111 coupled to inverter 112. Inverter 112 includes p-channel metal-oxide semiconductor (PMOS) transistor M1 and n-channel metal-oxide semiconductor (NMOS) transistor M2. As shown, a gate of transistor M2 is coupled to a gate of transistor M1 at input line 111, a source of transistor M1 is coupled to a supply voltage ($V_{cc}$), a drain of transistor M1 is coupled to a drain of transistor M2, and a source of transistor M2 is coupled to $V_{ss}$.

Input line 111 is also coupled to an input of delay element 1.13, which comprises PMOS transistor M3 and NMOS transistor M4. More specifically, delay element 113 comprises a pass gate, with a gate of transistor M3 coupled to $V_{ss}$ and a gate of transistor M4 coupled to $V_{cc}$. Moreover, the drains of transistors M3 and M4 are coupled to one another, as are the sources of transistors M3 and M4. In some embodiments, a propagation delay associated with delay element 113 is matched to a propagation delay associated with inverter 112.

Driver 110 further comprises NMOS transistor M5 and NMOS transistor M6. A gate of transistor M5 is coupled to an output of inverter 112 and a drain of transistor M5 is coupled to a voltage $V_{HI}$ that is less than $V_{CC}$. A gate of transistor M6 is coupled to an output of delay element 113 and a source of transistor M6 is coupled to $V_{ss}$. A drain of transistor M6 is coupled to a source of transistor M5 at output line 114 of driver 110. Output line 114 is in turn coupled to interconnect 120.

In one example of operation, driver 110 converts a full-swing input signal to a low-swing signal. More specifically, an input signal of "0" turns transistor M5 on and turns transistor M6 off after a propagation delay associated with inverter 112 and delay element 113. Since transistor M5 is coupled to $V_{HI}$ and not to $V_{CC}$, a low-voltage representation of a "1" is transmitted to interconnect 120. If the input signal is "1", M6 is turned on and M5 is turned off, resulting in the transmission of a low-voltage representation of a "0". The transmitted low-swing signals may be inverted when received to directly represent their corresponding input signals.

Transmission of a low-voltage signal along interconnect 120 may provide reduced capacitive coupling between adjacent interconnects within a bus that is composed of several instances of system 100. In some embodiments, interconnect 120 does not comprise a repeater, which may provide power and die area savings in comparison to systems using bus repeaters. According to some embodiments, interconnect 120 is not pre-charged and evaluated according to dynamic bus protocols. Such embodiments may provide power savings, particularly in the absence of switching activity, over some dynamic bus-based systems.

Figure 4:
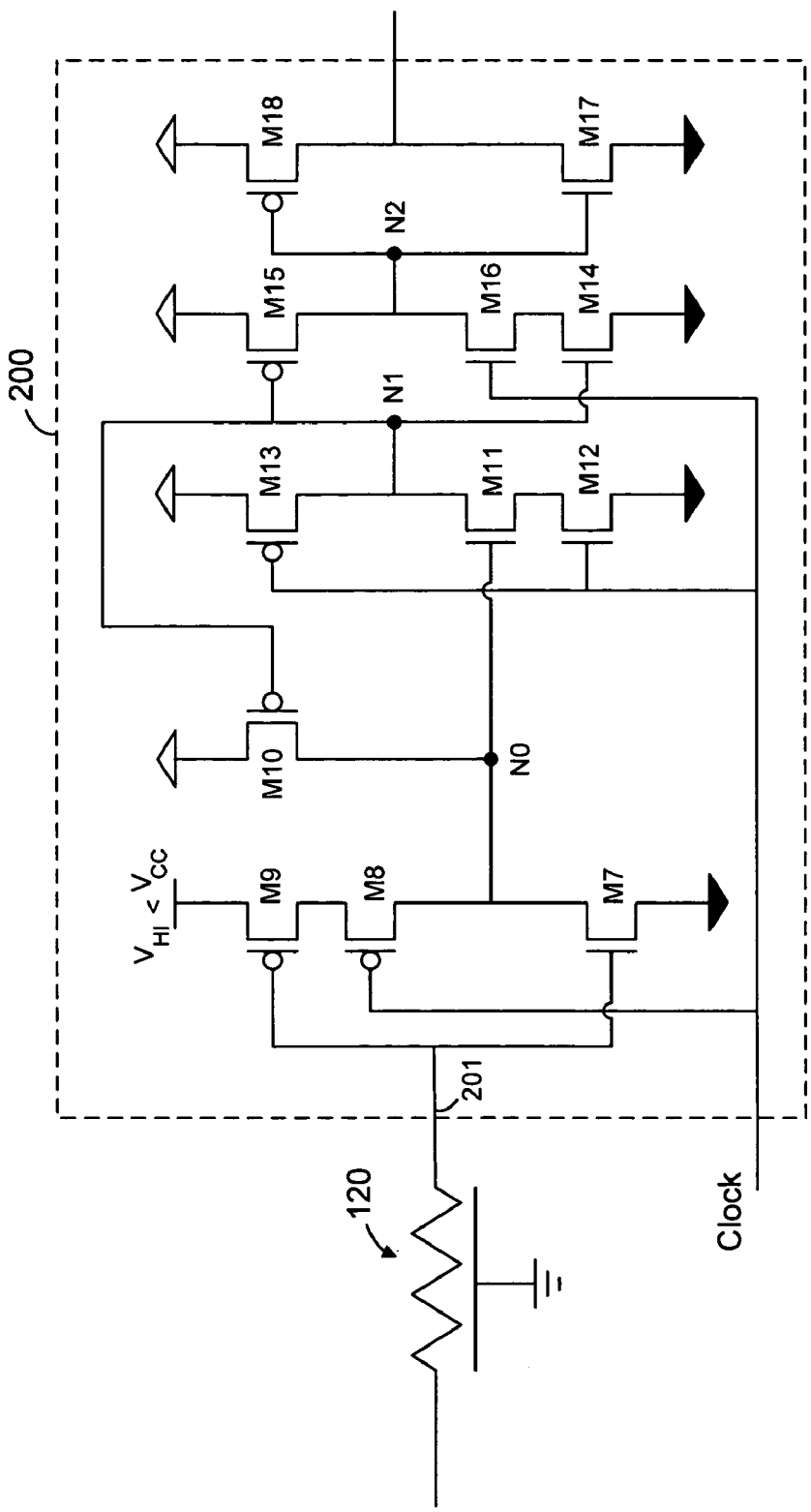
FIG. 4 is a schematic diagram of a receiver according to some embodiments.

FIG. 4 is a schematic diagram of receiver 200 according to some embodiments. Receiver 200 may be used to implement dynamic receiver circuit 130 of system 100. Receiver 200 comprises a true single phase clock-style positive edge-triggered level-restoring flip-flop according to some embodiments. Receiver 200 may operate to receive a low-swing signal from interconnect 120 and to convert the low-swing signal to a full-swing signal.

Receiver 200 comprises NMOS transistor M7, PMOS transistor M8, and PMOS transistor M9. Respective gates of transistors M7 and M9 are coupled to input line 201, which is in turn coupled to interconnect 120. A source of transistor M9 is coupled to $V_{HI}$, and a source of transistor M7 is coupled to $V_{SS}$. A drain of transistor M9 is coupled to a source of transistor M8, and a drain of transistor M8 is coupled to a drain of transistor M7. Transistor M8 receives a clock signal at its gate.

Node N0 is located at the coupling of transistors M7 and M8. Also coupled to node N0 is a drain of PMOS transistor M10. A source of transistor M10 is coupled to $V_{CC}$. Node N0 is also coupled to a gate of NMOS transistor M11.

A source of transistor M11 is coupled to a drain of NMOS transistor M12, whose source is coupled to $V_{SS}$. A drain of transistor M11 is coupled to a drain of PMOS transistor M13 at node N1, and a source of transistor M13 is coupled to $V_{CC}$. Both gates of transistors M12 and M13 are coupled to the clock signal.

Node N1 is coupled to the gates of NMOS transistor M14 and PMOS transistor M15. A source of transistor M15 is coupled to $V_{CC}$, and a source of transistor M14 is coupled to $V_{SS}$. A drain of transistor M15 is coupled to a drain of NMOS transistor M16, and a source of transistor M16 is coupled to a drain of transistor M14. The clock signal is coupled to a gate of transistor M16.

Node N2 is located at the coupling of transistors M15 and M16. Also coupled to node N2 are the gates of NMOS transistor M17 and PMOS transistor M18. A source of transistor M18 is coupled to $V_{CC}$ and a source of transistor M17 is coupled to $V_{SS}$. The drains of transistors M17 and M18 meet at the output of receiver 200.

During a pre-charge phase, node N1 is coupled to $V_{CC}$ via transistor M13 and is therefore pre-charged to "1". Transistor M10 is therefore off because its gate is coupled to node N1. Node N0 is therefore charged based on the signal on input line 201. More particularly, the signal on input line 201 is inverted during pre-charge by virtue of an inverter formed by transistors M7 and M9, and the inverted signal is reflected at node N0.

The clock signal goes high during the evaluation phase of receiver 200, therefore transistor M8 turns off and the value at node N0 is held dynamically. In particular, node N1 discharges through transistors M11 and M12 if a "1" was stored at node N0 during the pre-charge phase, which turns on transistor M10 and pulls node N0 to $V_{CC}$. If a "0" was stored at node N0 during the pre-charge phase, then transistors M11, M13, M16 and M15 are off, causing node N1 to remain at "1" and node N0 to remain at "0".

Transistor M16 is turned on during the evaluation phase, therefore the value of node N1 is inverted to node N2 and then inverted again by the inverter composed of transistors M17 and M18. The signal on input line 201 is therefore inverted four times and converted to a full-swing signal before being output by receiver 200.

By utilizing pre-charging of one internal node according to some embodiments, receiver 200 may provide a system that reduces bus power requirements in comparison to some dynamic bus systems.

Figure 5:
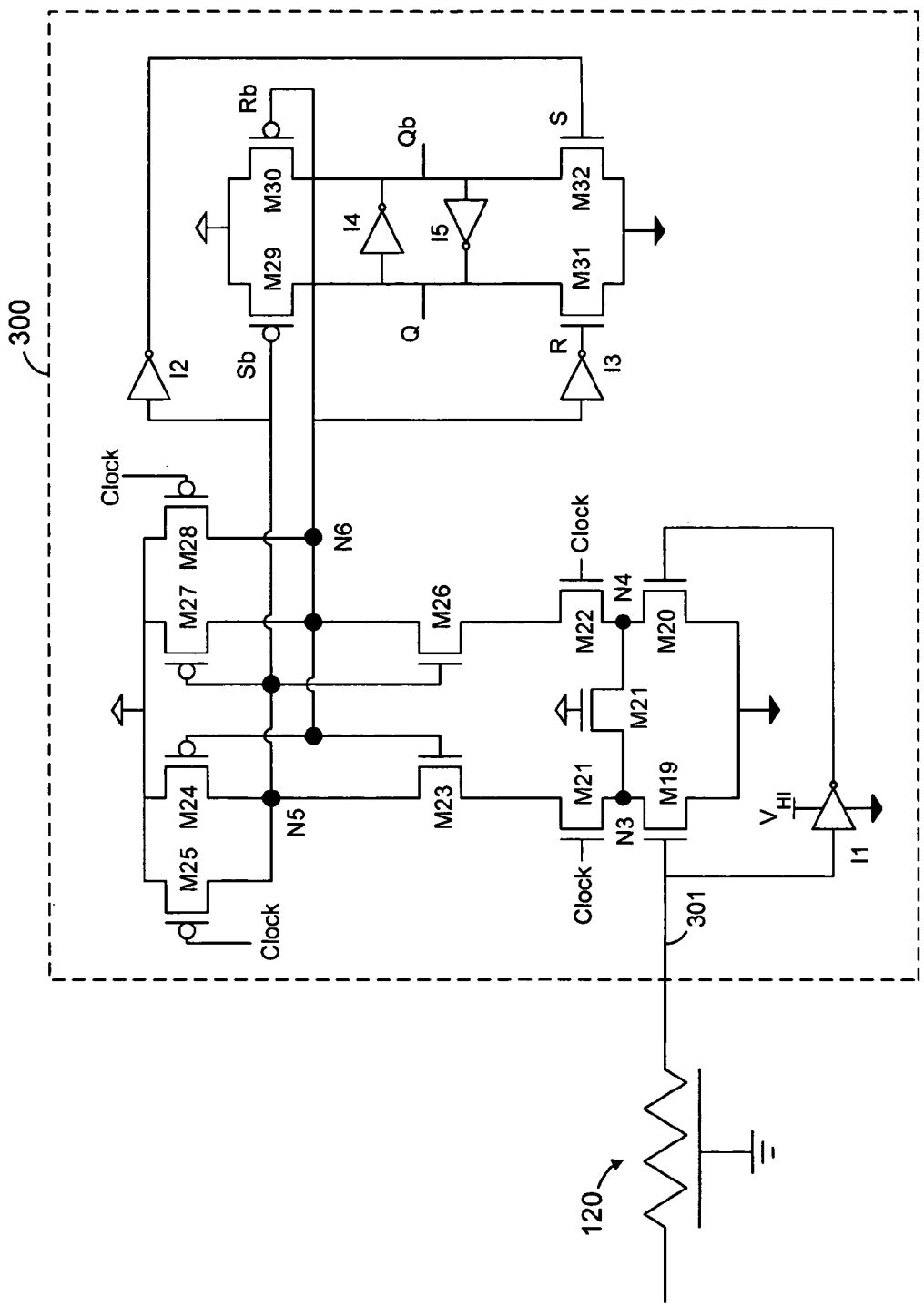
FIG. 5 is a schematic diagram of a receiver according to some embodiments.

FIG. 5 is a schematic diagram of receiver 300 according to some embodiments. Receiver 300 may be used to implement dynamic receiver circuit 130 of system 100. Receiver 300 comprises a positive edge-triggered dynamic sense-amplifying flip-flop according to some embodiments. Receiver 300 may operate to receive a low-swing signal from interconnect 120 and to convert the low-swing signal to a full-swing signal.

Input line 301 is coupled to interconnect 120 and to a gate of NMOS transistor M19 according to some embodiments. Input line 301 is also coupled to an input of inverter 11, which is supplied by voltages $V_{HI}$ and $V_{SS}$ because these voltages are the voltages based on which driver 110 generates a low-swing signal that is received by receiver 300.

An output of inverter is coupled to a gate of NMOS transistor M20. The sources of transistors M19 and M20 are both coupled to $V_{SS}$. The drains of transistors M19 and M20 are coupled to a drain and a source of NMOS transistor M21 at node N3 and node N4 respectively, with a gate of transistor M21 being coupled to $V_{CC}$. Sources of NMOS transistors M22 and M23 are also respectively coupled to nodes N3 and N4, and the gates of transistors M22 and M23 are coupled to a clock signal.

A drain of transistor M23 is coupled to a drain of transistor M24 and to a drain of transistor M25 at node N5. A gate of transistor M23 is coupled to a gate of transistor M24 and a gate of transistor M25 is coupled to the clock signal. Sources of transistors M24 and M25 are coupled to $V_{CC}$.

A drain of transistor M26 is coupled to a drain of transistor M27 and to a drain of transistor M28 at node N6. A gate of transistor M26 is coupled to a gate of transistor M27 and a gate of transistor M28 is coupled to the clock signal. Sources of transistors M27 and M28 are coupled to $V_{CC}$. The gate of transistor M23 and the gate of transistor M24 are also coupled to node N6, and the gate of transistor M26 and the gate of transistor M27 are also coupled to node N5. Node N5 and node N6 reflect the values of output stage control signals S, Sb and R, Rb, respectively.

Node N5 is coupled to an input of inverter 12 and to a gate of PMOS transistor M29. Node N6 is coupled to an input of inverter 13 and to a gate of PMOS transistor M30. The sources of transistors M29 and M30 are coupled to $V_{CC}$. The drain of transistor M29 is coupled to output line Q, to an input of inverter 14, to an output of inverter 15, and to a drain of NMOS transistor M31. The drain of transistor M30 is coupled to output line Qb, to an output of inverter 14, to an input of inverter 15, and to a drain of NMOS transistor M32.

The sources of transistors M31 and M32 are coupled to $V_{SS}$. A gate of transistor M31 is coupled to an output of inverter 13, and a gate of transistor M32 is coupled to an output of inverter 12.

In operation, nodes N5 and N6 are pre-charged to "1" through transistors M25 and M28 when the clock signal is low. These values turn off transistors M29 and M30 and also turn off transistors M31 and M32 after passing through inverters 12 and 13, respectively. Accordingly, cross-coupled inverters 14 and 15 hold a previous state on output lines Q and Qb during the pre-charge phase. Also during the pre-charge phase, the low clock signal turns off transistors M21 and M22 to isolate the value on input line 301 from the output stage.

The clock signal goes high during the evaluation phase and turns on transistors M21 and M22, causing either node N5 or node N6 to discharge depending on the value of the input signal on input line 301. More specifically, if the input signal is a low-swing "0" during the evaluation phase, transistor M19 will be turned off and transistor M20 will be turned on. Node N6 will therefore discharge to "0" through transistors M22 and M20, and node N5 will remain at "1". Control signals R and Rb will therefore be set to "1" and "0", thereby discharging Q through transistor M31 and charging Qb through transistor M30.

According to some embodiments, one of node N3 and node N4 is left in a high impedance state with a "0" present on the node if the input signal changes during the evaluation phase. Leakage currents may then charge the one node and cause the latch to flip state before a next rising edge of the clock signal.

Figure 6:
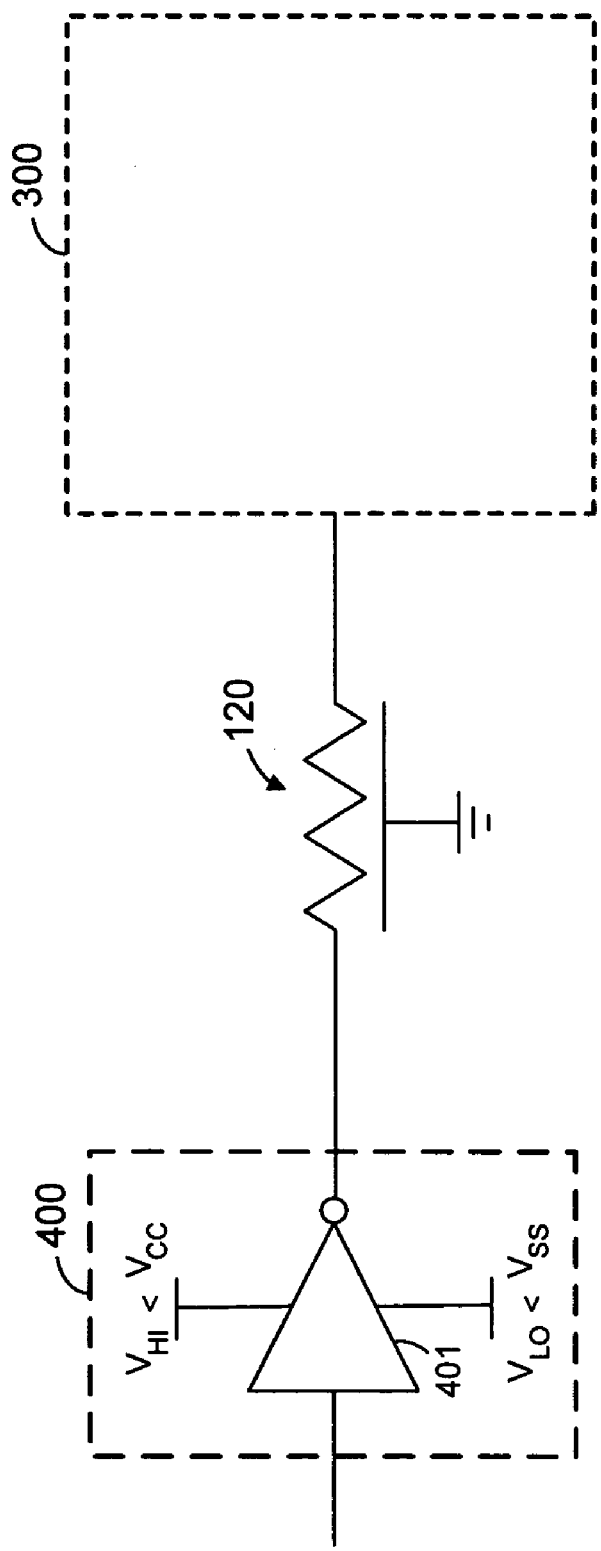
FIG. 6 is a schematic diagram of a driver according to some embodiments.

Leakage in inverter I1 may be reduced by virtue of its connection to the same reduced-window supply voltages that are used by a driver from which receiver 300 receives a signal. In this regard, FIG. 6 is a schematic diagram of driver 400 that may be used in conjunction with receiver 300 according to some embodiments. Driver 400 comprises inverter 401 supplied by reduced-window supply voltages $V_{HI}$ and $V_{LO}$. Voltage $V_{LO}$ is greater than $V_{SS}$ used by driver 110. As a result, driver 400 may generate output signals having a smaller voltage range than those transmitted by driver 110. FIG. 6 shows driver 400 coupled to receiver 300 via interconnect 120. In some embodiments, receiver 300 of FIG. 6 is identical to receiver 300 of FIG. 5 except that inverter I1 is coupled to voltage $V_{LO}$ instead of to voltage $V_{SS}$.

Figure 7:
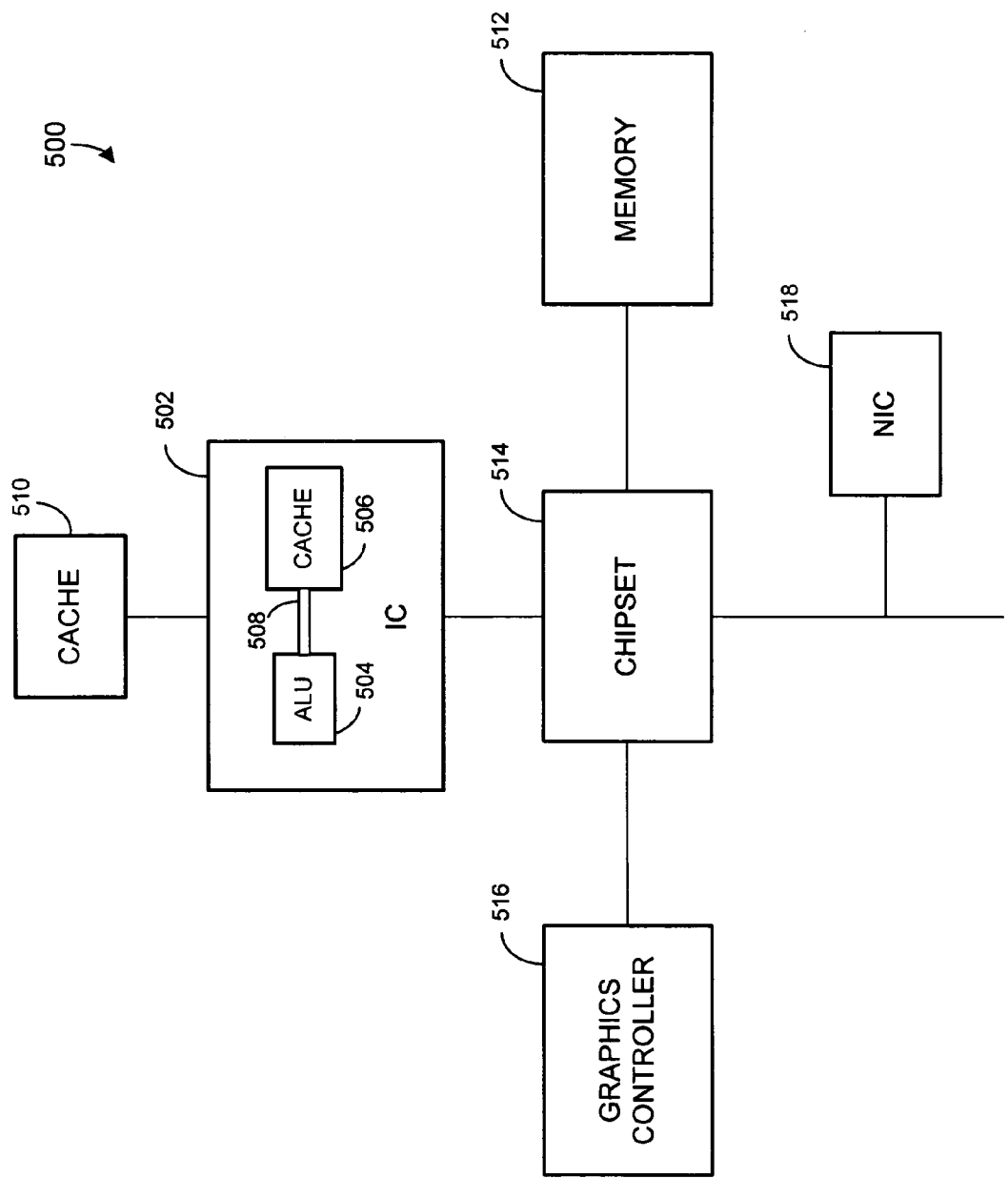
FIG. 7 is a block diagram of a system according to some embodiments.

FIG. 7 illustrates a block diagram of system 500 according to some embodiments. System 500 includes integrated circuit 502 which may be a microprocessor or another type of integrated circuit. Integrated circuit 502 comprises sub-blocks such as arithmetic logic unit (ALU) 504 and on-die cache 506, which communicate with one another via bus 508. According to some embodiments, bus 508 comprises multiple instances of interconnects 120 as described above, and ALU 504 and cache 506 each include instances of driver 110 and receiver 130 for transmitting and receiving data to one another over bus 508.

Integrated circuit 502 may communicate with off-die cache 510. Integrated circuit 502 may also communicate with system memory 512 via a host bus and chipset 514. Communication between integrated circuit 502 and off-die cache 510 and/or chipset 514 may proceed over a system such as system 100. System memory 512 may comprise any type of memory for storing data, such as a Single Data Rate Random Access Memory, a Double Data Rate Random Access Memory, or a Programmable Read Only Memory. Other off-die functional units, such as graphics controller 516 and Network Interface Controller (NIC) 518, may communicate with integrated circuit 502 via appropriate busses or ports.

The several embodiments described herein are solely for the purpose of illustration. Embodiments may include any currently or hereafter-known versions of the elements described herein. Therefore, persons skilled in the art will recognize from this description that other embodiments may be practiced with various modifications and alterations.

What is claimed is:

1. A circuit comprising:
   a static low-swing driver circuit to receive a full-swing input signal, to convert the full-swing input signal to a low-swing signal, and to transmit the low-swing signal, the driver circuit comprising:
   an input line to receive the full-swing input signal;
   an inverter coupled to a supply voltage, the input line coupled to an input of the inverter;
   a delay element coupled to the supply voltage, the input line coupled to an input of the delay element, and a propagation delay associated with the delay element matching a propagation delay associated with the inverter;
   a first transistor, a gate of the first transistor coupled to an output of the inverter and a drain of the transistor coupled to a first voltage, the first voltage less than the supply voltage;
   a second transistor, a gate of the second transistor coupled to an output of the delay element and a drain of the second transistor coupled to a source of the first transistor at an output node; and
   an output line coupled to the output node, the output line to transmit the low-swing signal; and
   a dynamic receiver circuit to receive the low-swing signal and to convert the low-swing signal to a full-swing signal.

2. A circuit according to claim 1, further comprising:
   an interconnect coupled to the driver circuit and to the receiver circuit, the interconnect to receive the low-swing signal from the driver circuit and to transmit the low-swing signal to the receiver circuit,
   wherein the interconnect does not comprise a repeater.

3. A circuit according to claim 1, wherein the receiver circuit comprises a positive edge-triggered dynamic sense-amplifying flip-flop.

4. A circuit according to claim 1, wherein the receiver circuit comprises a true single phase clock-style positive edge-triggered level-restoring flip-flop.

5. A circuit according to claim 4, wherein the receiver circuit comprises:
   an input line to receive the low-swing signal;
   an inverter coupled to $V_{ss}$ and to a first voltage less than $V_{cc}$, the inverter coupled to a clock signal to control signal propagation through the inverter an input of the inverter coupled to the input line; and
   a pull-up transistor coupled an output of the inverter and to $V_{cc}$.

6. A driver circuit comprising:
   a driver input line to receive a full-swing input signal;
   an inverter coupled to a supply voltage, the input line coupled to an input of the inverter;
   a delay element coupled to the supply voltage, the input line coupled to an input of the delay element, and a propagation delay associated with the delay element matching a propagation delay associated with the inverter;

a first transistor, a gate of the first transistor coupled to an output of the inverter and a drain of the transistor coupled to a first voltage, the first voltage less than the supply voltage;

a second transistor, a gate of the second transistor coupled to an output of the delay element and a drain of the second transistor coupled to a source of the first transistor at an output node; and a driver output line coupled to the output node, the output line to transmit a low-swing signal.

7. A circuit according to claim 6, further comprising:

an interconnect coupled to the driver output line, the interconnect to receive the low-swing signal from the driver circuit and to transmit the low-swing signal to a receiver circuit, wherein the interconnect does not comprise a repeater.

8. A system comprising:

a microprocessor comprising:

a static low-swing driver circuit to receive a full-swing input signal, to convert the full-swing input signal to a low-swing signal, and to transmit the low-swing signal, the driver circuit comprising:

an input line to receive the full-swing input signal;

an inverter coupled to a supply voltage, the input line coupled to an input of the inverter;

a delay element coupled to the supply voltage, the input line coupled to an input of the delay element, and a propagation delay associated with the delay element matching a propagation delay associated with the inverter;

a first transistor, a gate of the first transistor coupled to an output of the inverter and a drain of the transistor coupled to a first voltage, the first voltage less than the supply voltage;

a second transistor, a gate of the second transistor coupled to an output of the delay element and a drain of the second transistor coupled to a source of the first transistor at an output node; and an output line coupled to the output node, the output line to transmit the low-swing signal;

a dynamic receiver circuit to receive the low-swing signal and to convert the low-swing signal to a full-swing signal; and a double data rate memory coupled to the microprocessor.

9. A system according to claim 8, the microprocessor further comprising:

an interconnect coupled to the driver circuit and to the receiver circuit, the interconnect to receive the low-swing signal from the driver circuit and to transmit the low-swing signal to the receiver circuit, wherein the interconnect does not comprise a repeater.

10. A system according to claim 8, wherein the receiver circuit comprises a positive edge-triggered dynamic sense-amplifying flip-flop.

11. A system according to claim 8, wherein the receiver circuit comprises a true single phase clock-style positive edge-triggered level-restoring flip-flop.

12. A circuit comprising:

a static low-swing driver circuit to receive a full-swing input signal, to convert the full-swing input signal to a low-swing signal, and to transmit the low-swing signal; and a dynamic receiver circuit to receive the low-swing signal and to convert the low-swing signal to a full-swing signal, the receiver circuit comprising:

a true single phase clock-style positive edge-triggered level-restoring flip-flop;

an input line to receive the low-swing signal;

an inverter coupled to $V_{ss}$ and to a first voltage less than $V_{cc}$, the inverter coupled to a clock signal to control signal propagation through the inverter an input of the inverter coupled to the input line; and a pull-up transistor coupled an output of the inverter and to $V_{cc}$.

* * * * *